United States Patent
Harun et al.

(10) Patent No.: US 7,042,098 B2
(45) Date of Patent: May 9, 2006

(54) BONDING PAD FOR A PACKAGED INTEGRATED CIRCUIT

(75) Inventors: Fuaida Harun, Selangor (MY); Liang Jen Koh, Selangor (MY); Lan Chu Tan, Selangor (MY)

(73) Assignee: Freescale Semiconductor, INC, Austin, TX (US)

( * ) Notice: Subject to any disclaimer, the term of this patent is extended or adjusted under 35 U.S.C. 154(b) by 0 days.

(21) Appl. No.: 10/613,703

(22) Filed: Jul. 7, 2003

(65) Prior Publication Data
US 2005/0006734 A1    Jan. 13, 2005

(51) Int. Cl.
H01L 23/02   (2006.01)
H01L 23/48   (2006.01)
H01L 23/52   (2006.01)

(52) U.S. Cl. .............. 257/774; 257/784; 257/786; 257/700; 257/701; 257/758; 257/702; 257/698; 257/734; 257/773; 257/780; 257/781; 257/737; 257/668; 361/767; 361/768; 174/252; 174/259; 29/846

(58) Field of Classification Search ........ 257/774, 257/668, 700–703, 758, 698, 690–693, 784, 257/786, 780, 781, 773; 361/767, 768, 262, 361/782, 719; 174/252, 259, 255, 266; 29/846
See application file for complete search history.

(56) References Cited

U.S. PATENT DOCUMENTS

| 5,562,971 | A | * | 10/1996 | Tsuru et al. | 428/209 |
|---|---|---|---|---|---|
| 5,612,576 | A | * | 3/1997 | Wilson et al. | 257/788 |
| 5,798,571 | A | * | 8/1998 | Nakajima | 257/784 |
| 5,872,399 | A | * | 2/1999 | Lee | 257/738 |
| 5,886,876 | A | * | 3/1999 | Yamaguchi | 361/767 |
| 5,962,917 | A | * | 10/1999 | Moriyama | 257/697 |
| 6,054,755 | A | * | 4/2000 | Takamichi et al. | 257/667 |
| 6,097,089 | A | * | 8/2000 | Gaku et al. | 257/712 |
| 6,100,475 | A | * | 8/2000 | Degani et al. | 174/264 |
| 6,121,553 | A | * | 9/2000 | Shinada et al. | 174/259 |
| 6,172,419 | B1 | * | 1/2001 | Kinsman | 257/737 |
| 6,199,273 | B1 | * | 3/2001 | Kubo et al. | 29/843 |
| 6,221,690 | B1 | * | 4/2001 | Taniguchi et al. | 438/106 |
| 6,295,077 | B1 | * | 9/2001 | Suzuki | 347/237 |
| 6,376,908 | B1 | * | 4/2002 | Gaku et al. | 257/707 |
| 6,396,135 | B1 | * | 5/2002 | Narvaez et al. | 257/678 |
| 6,441,493 | B1 | * | 8/2002 | Kim | 257/773 |

(Continued)

OTHER PUBLICATIONS

Ker et al., "Design on the Low-Capacitance Bond Pad for High-Frequency I/O Circuits in CMOS Technology," *IEEE Transactions on Electron Devices*, vol. 48, No. 12, Dec. 2001, pp. 2953-2956.

Primary Examiner—Alexander Oscar Williams
(74) Attorney, Agent, or Firm—Charles Bergere

(57) ABSTRACT

An integrated circuit is packaged using a package substrate that has a bottom side with a regular array of connection points and a top side with the integrated circuit on it. Vias in the package substrate provide electrical connection between the top and bottom sides. The vias have a via capture pad to which a wire may be wire bonded so that the wires from the IC to the substrate top side directly contact the vias at their capture pads without the need for traces from a top side bond pad to a via. The via capture pad is shaped to include at least one sharp edge to improve the ability of a wirebonder with pattern recognition software to locate the capture pad and place the wire.

18 Claims, 2 Drawing Sheets

U.S. PATENT DOCUMENTS

| | | | |
|---|---|---|---|
| 6,474,476 B1* | 11/2002 | Anderson et al. | 206/725 |
| 6,495,394 B1* | 12/2002 | Nakata et al. | 438/107 |
| 6,506,633 B1* | 1/2003 | Cheng et al. | 438/126 |
| 6,617,680 B1* | 9/2003 | Chien-Chih et al. | 257/698 |
| 6,716,657 B1* | 4/2004 | Soh | 438/29 |
| 6,720,651 B1* | 4/2004 | Gaku et al. | 257/707 |
| 6,734,552 B1* | 5/2004 | Combs et al. | 257/707 |
| 6,756,665 B1* | 6/2004 | Chang | 257/691 |
| 6,807,131 B1* | 10/2004 | Hesselink et al. | 369/13.13 |
| 6,812,580 B1* | 11/2004 | Wenzel et al. | 257/784 |
| 6,861,750 B1* | 3/2005 | Zhao et al. | 257/739 |
| 6,872,590 B1* | 3/2005 | Lee et al. | 438/106 |
| 6,889,429 B1* | 5/2005 | Celaya et al. | 29/840 |
| 2002/0066948 A1* | 6/2002 | Kim | 257/678 |
| 2002/0066949 A1* | 6/2002 | Ahn et al. | 257/684 |
| 2002/0100967 A1* | 8/2002 | Gaku et al. | 257/707 |
| 2002/0172025 A1* | 11/2002 | Megahed et al. | 361/767 |
| 2003/0015786 A1* | 1/2003 | Yamamura | 257/691 |
| 2003/0082845 A1 | 5/2003 | Hoffman et al. | |
| 2003/0082848 A1* | 5/2003 | Ohuchida | 438/106 |
| 2003/0207516 A1* | 11/2003 | Tan et al. | 438/200 |
| 2004/0072389 A1* | 4/2004 | Chen et al. | 438/127 |
| 2004/0119168 A1* | 6/2004 | Downey et al. | 257/774 |
| 2004/0124545 A1* | 7/2004 | Wang | 257/784 |
| 2004/0171189 A1* | 9/2004 | Gaku et al. | 438/106 |
| 2005/0121767 A1* | 6/2005 | Celaya et al. | 257/692 |

* cited by examiner

BONDING PAD FOR A PACKAGED INTEGRATED CIRCUIT

BACKGROUND OF THE INVENTION

The present invention relates to packaged integrated circuits, and more particularly, to bonding pads of integrated circuits that are packaged and have wire bonds.

Integrated circuits are continuing to become smaller and more complex. As circuit complexity has increased, so has the need for more input and output signals. Ball grid array (BGA) is an important package type for integrated circuits that typically uses wire bonds in making electrical connection between the integrated circuit and one part of the BGA package. BGA packages generally have an integrated circuit mounted on a top side of a package substrate and an array of solder balls on a bottom side of the package substrate. Then, bonding pads on the integrated circuit are connected to wire bond fingers on the package substrate with wires. The wire bond fingers typically are connected to traces, which in turn are connected to via capture pads to vias and finally to the solder balls on the bottom side of the package substrate.

Wirebonding machines use pattern recognition software to locate the wires on the bonding pads. However, as the number of I/O signals has increased, there are more bonding pads and therefore more wires, yet the size and pitch of the bonding pads has decreased. Thus, it can be difficult to reliably connect the wires to the bonding pads. Common problems are wires shorting with other wires and wires not staying attached or making good electrical contact with a bonding pad.

BGA packages are particularly beneficial for high performance integrated circuits in which low cost is significant. This applies to many integrated circuits such as microcomputers and static random access memories (SRAMs).

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

Those of skill in the art will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

An integrated circuit is packaged using a package substrate that has a bottom side with a regular array of connection points and a top side with the integrated circuit on it. The package substrate has vias that provide electrical connection between the top and bottom sides. The vias have a via capture pad that directly receives a bond wire used to electrically connect a bond pad on the integrated circuit with a connection point on the substrate bottom side by way of the via. The via capture pad includes at least one sharp edge that enhances the ability of a wirebonder patter recognition program to identify the via capture pad and locate the bond wire thereon. This helps to improve wirebond reliability, which improves cost.

In one embodiment, the present invention is a bonding pad electrically coupled to a via. The via extends from one side of a substrate to an opposing side of a substrate. The bonding pad includes a photo mask area that surrounds the via, a clearance area located within the photo mask area and surrounding the via, and a land area, located within the clearance area, that also surroundings the via. The land area is for receiving at least one bond wire. At least one of the photo mask area, the clearance area and the land area has at least one sharp edge that assists a pattern recognition system of a wire bonder in locating the at least one bond wire on the land area.

In another embodiment, the present invention is a package substrate for an integrated circuit including a top traceless surface, a bottom traceless surface, and a plurality of vias in the package substrate that extend between the top and bottom traceless surfaces. Each of the plurality of vias includes one of a plurality of via capture pads arranged on the top traceless surface. Each via capture pad includes at least one sharp edge that assists a pattern recognition system of a wire bonder in locating at least one bond wire on the via capture pad.

Figure 1:
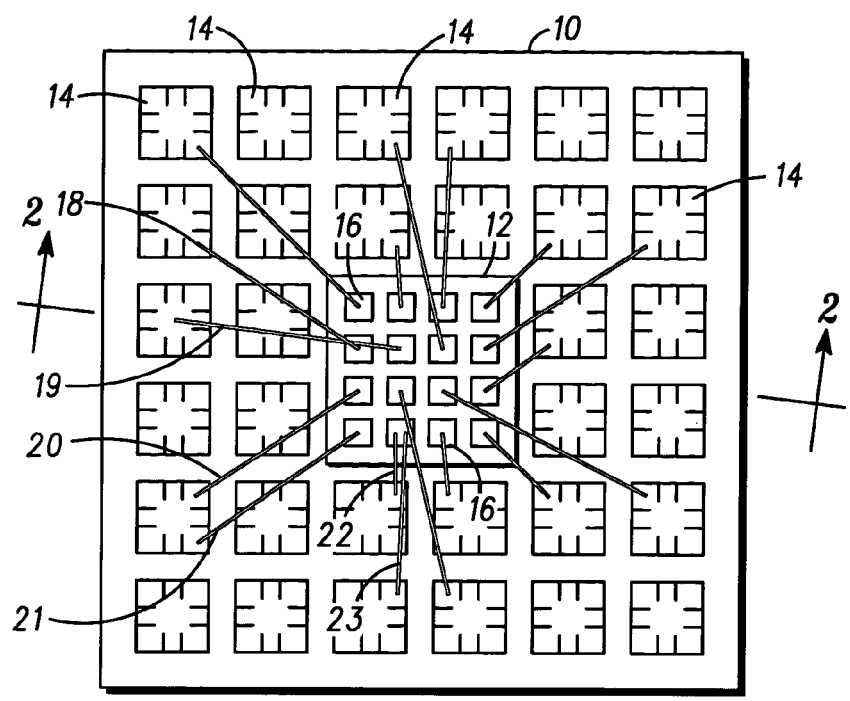
FIG. 1 is a top view of a package substrate with an integrated circuit mounted thereon according to one embodiment of the invention.

Referring now to FIG. 1, a top plan view of a package substrate 10 and an integrated circuit 12 is shown. The package substrate 10 is preferably formed of circuit board material, such as FR4, FR5 or BT (Bismaleimide/Triazine). The package substrate 10 has a plurality of bonding pads or via capture pads 14 arranged in a regular array, in this case, a 6×6 array on a top side thereof and a plurality of connection points on its bottom side (not shown). Preferably, the top and bottom surfaces of the package substrate 10 are traceless, as discussed in more detail below. The integrated circuit 12 has IC pads 16 located on a top side thereof. The IC pads 16 can be any common IC pads that are capable of being wire bonded. The IC pads 16 are shown in an array. However, the IC pads 16 could be along the periphery of the integrated circuit 12 or arranged in other ways. The IC pads 16 are electrically connected to the via capture pads 14 with bond wires. Exemplary wires that are wire bonded between the IC pads 16 and the via capture pads 14 are wires 18, 19, 20, 21, 22 and 23. Note that some of the wires may cross. In the example shown in FIG. 1, wires 18 and 19 cross. In order to prevent shorts, the wires are preferably insulated or coated wires. Insulated wires are beneficial, even though more expensive than bare wire, for many applications because they may allow for a larger diameter wire, such as one having a diameter greater than 25.5 microns, which have a lower resistance than is typical. The lower resistance can reduce adverse effects associated with the resistance of wires used in wire bonding. An alternative to having the wires 18–23 being insulated is to allow for varying loop heights and profiles for the wires. Wire bonding equipment does allow for this option. Oftentimes there is a one to one correspondence between a via capture pad and an IC pad. However, in the present example, more than one IC pad may be wire bonded to the same via capture pad (see wires 20 and 21) and the same IC pad may be wired to more than one via capture pad (see wires 22 and 23). Further, although not shown, wires could be connected directly between two via capture pads. This can be particularly useful in connecting power supply voltages, such as Vdd and ground.

The integrated circuit 12 has an active portion where transistors are present. The IC pads 16 may be over this active portion or over areas that are not part of the active portion. There may be a benefit of having at least some of the IC pads 16 over the active portion because of the flexibility of placing the pads, which may result in no wires crossing over. This may allow not having to use insulated wires or altering the wire height.

Figure 2:
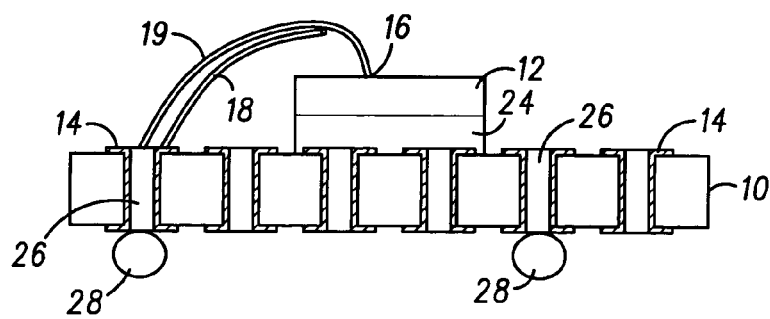
FIG. 2 is a cross-sectional view of the package substrate and IC of FIG. 1 taken along line 2—2.

FIG. 2 is a cross-sectional sectional view taken along line 2—2 of the substrate 10, which is along the wire 19. The integrated circuit 12 is attached to the substrate 10 with a die attach material 24. The die attach material 24 may be either an insulating material or conductive. If the vias under the integrated circuit 12 are supplying a ground connection, there is a benefit for the die attach material 24 to be conductive. Conductive die attach material also may be useful for thermal conduction.

FIG. 2 also shows vias 26 in the package substrate 10 that extend between the top and bottom sides. The vias 26 provide electrical connection between the top side of the package substrate 10 and the bottom side. Each of the vias 26 has a corresponding via capture pad 14. As can be seen, the wire 19 is wire bonded to one of the IC pads 16 and to the via capture pad 14 of one of the vias 26. Preferably the wire 19 is in direct contact with the via 26 through the via capture pad 14. Thus, the vias 26 are directly wire bonded to the wires without requiring traces such that traceless conductors (i.e. the insulated wires) couple the integrated circuit 12 with the vias 26. Solder balls 28 are attached to the vias at the bottom of the substrate package 10 in a manner known by those of skill in the art, thereby forming a BGA package. The application of solder balls may not be required for an application using a land grid array (LGA) type of package. In such a case the contacts on the bottom side are in an array (equally spaced in the row direction and equally spaced in the column direction but not necessarily the same spacing in the row and column direction) and electrical contact is made with a pad rather than solder balls. A portion of the array of electrical contact pads on the bottom side of the substrate 10 may be missing a portion under the likely area for an integrated circuit and still be considered an array.

Figure 3:
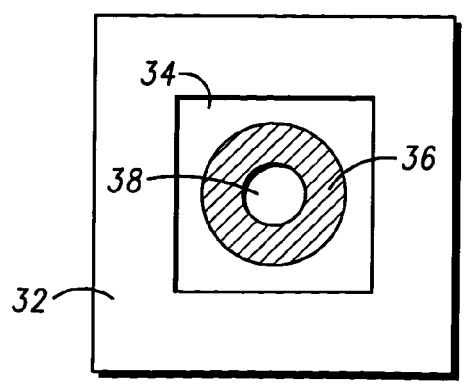
FIG. 3 is a greatly enlarged top view of a bonding pad in accordance with a first embodiment of the invention.

Referring now to FIGS. 3–6, various embodiments of bonding pads or via capture pads are shown. FIG. 3 is a greatly enlarged top view of a first embodiment of a bonding pad or via capture pad 30 located on a surface of a package substrate. The bonding pad 30 is located over and in contact with a via, such as the vias 26 shown in FIG. 2. The bonding pad 30 includes a photo mask area 32. The photo mask area 32 comprises a solder mask over BT. The photo mask area 32 is preferably rectangular shaped. A clearance area 34 is located within the photo mask area 32. The clearance area 34 is an area between the bond area and the solder mask opening or a clearance of a wire loop to a land area 36. The clearance area 34 is preferably formed of the same material as the package substrate. In the presently preferred embodiment, the clearance area is formed of BT (Bismaleimide/Triazine). Further, the clearance area 34 preferably has the same shape as the photo mask area 32, e.g., rectangular shaped, although this is not a requirement.

As is known by those of skill in the art, vias have a surface that is exposed at a substrate surface. This exposed portion is a land area 36. The land area 36 is located within the clearance area 34. The land area 36 is for receiving at least one bond wire, including coated or insulated bond wires. The land area 36 is formed of a material to which a wire bond can be made. Examples of such materials are gold, silver, palladium, copper, aluminum and combinations of conductive metals. Other materials may also be effective. In prior art designs, the bond pad finger is treated in the manner necessary for receiving a wire bond. The land area 36 of the present invention may also be treated in this way. Thus, any of the current techniques used for preparing a bond pad finger should be effective for treating the land area 36. The land area 36 may surround a plug 38 in the via that connects underlying metal layers as is known by those of skill in the art.

According to the present invention, at least one of the photo mask area 32, the clearance area 34 and the land area 36 has at least one sharp edge that assists a pattern recognition system of a wire bonder in locating one or more bond wires on the land area 36. In this embodiment, the photo mask area 32 and the clearance area 34 are rectangular and the land area 36 is generally round. The land area 36 is sized and shaped so that one or more wires, such as insulated wires having a diameter of about 25 microns, can be wire bonded to it.

Figure 4:
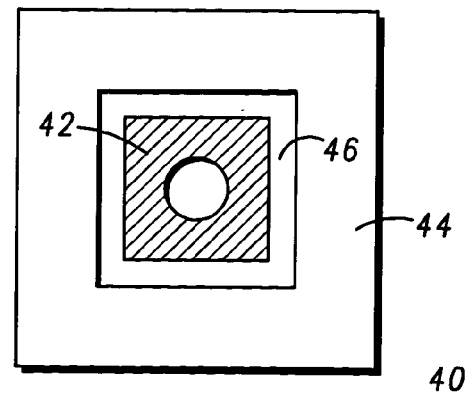
FIG. 4 is a greatly enlarged top view of a bonding pad in accordance with a second embodiment of the invention.

FIG. 4 shows a bonding pad 40 having the same construction as the bonding pad 30 (FIG. 3) except that it has a land area 42 that is generally rectangular. Thus, in this second embodiment, a photomask area 44, a clearance area 46 and the land area 42 all have a plurality of sharp edges that assist the pattern recognition system of the wire bonder in locating the land area 42 and attaching at least one bond wire thereto.

Figure 5:
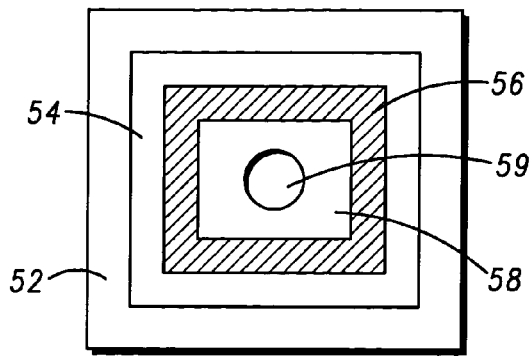
FIG. 5 is a greatly enlarged top view of a bonding pad in accordance with a third embodiment of the invention.

FIG. 5 is a top plan view of a third embodiment of a bonding pad 50 in accordance with the present invention. The bonding pad 50 includes a photo mask area 52, a clearance area 54 and a land area 56 like the bonding pads 30 and 40. However, the bonding pad 50 also includes a solder mask area 58 located within the land area 56 and surrounding a via plug 59. The purpose of the solder mask area 58 is to provide sufficient clearance to ensure the via is always covered by the solder mask.

Figure 6:
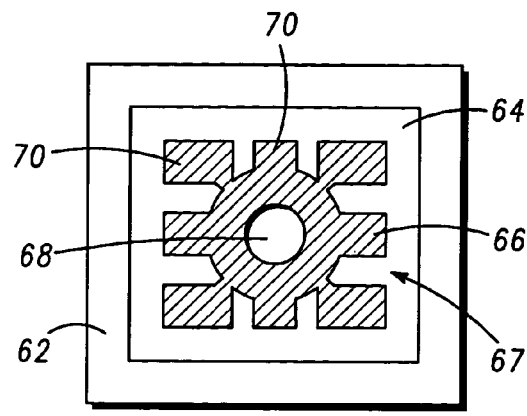
FIG. 6 is a greatly enlarged top view of a bonding pad in accordance with a fourth embodiment of the invention.

FIG. 6 is a top plan view of a fourth embodiment of a bonding pad 60 in accordance with the present invention. The bonding pad 60 includes a photo mask area 62 and a clearance area 64 like the bonding pads 30, 40 and 50. The bonding pad 60 also has a land area 66. The land area 66 is like the land area 42 (FIG. 2) except that the land area 66 has one or more cut outs 67 on each side that are perpendicular to the side edge and extend toward the via or a via plug 68. For a land area 66 that is about 0.46 microns×0.46 microns, the cut outs 67 are about 0.03 microns wide and about 0.10 microns deep. The inner edge of the cut out 67 may be curved, as shown in FIG. 6, or straight. With the cut-outs 67, the land area 66 has a plurality (in this case 8) sections 70 to which a wire may be bonded. Having more sharp edged or separate sections enhances the diebond and wirebonding placement accuracy through the equipment's Pattern Recognition system (PRS).

These embodiments provide a substantial cost benefit of either eliminating or greatly reducing top side traces and bond fingers. Particularly in high density applications, such top side traces and bond fingers require special processing etching for small line and space geometry. So the savings is particularly significant for those applications. Also the space available for routing of the traces can be limited and the traces under the integrated circuit must be insulated from the integrated circuit with a solder mask. Thus, the elimination of the traces prevents these costs completely and reducing the traces reduces the costs and substantially achieves commensurate reduction in complexity. The reduction in complexity should result in improved yield and design density. Further, the pad design allows for improved bond wire placement on the pad by the wire bonder because the pads are more readily located by the bond pad locating program (i.e. pattern recognition program) of the wire bond equipment.

Another benefit is the opportunity to use the same substrate for many different integrated circuit sizes and designs. The package substrates are generally made in sheets much larger than for a single integrated circuit. For the substrate 10 shown in FIG. 1, it can be cut from a sheet of a very large array of vias, and bond pads. Thus, regardless of the size of the integrated circuit, this array can be used.

Figure 7:
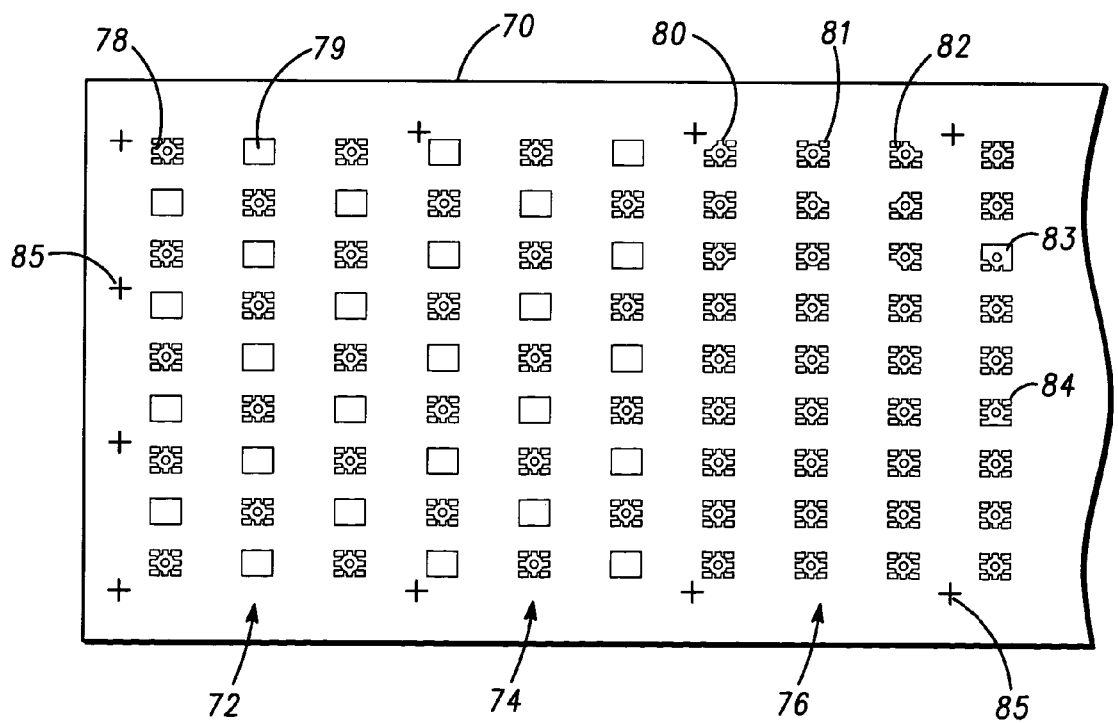
FIG. 7 is an enlarged plan view of a part of a package substrate sheet in accordance with an embodiment of the invention.

FIG. 7 shows a package substrate sheet 70 in accordance with the present invention. The package substrate sheet 70 comprises a large array of vias and via pads (bond pads). In one aspect of the invention, different arrays 72, 74 and 76 are arranged on the sheet 70. The different arrays 72, 74 and 76 may differ in size (rows×columns) and in the types (design) of the via pads that make up the array. In addition, via pads of differing patterns may be located at various locations, which facilitates using the sheet for different sized die. For example, a first array 72 is a 9×3 array and includes two different types of via pads 78 and 79 that are alternately located in the array. The via pad 78 is like the via pad 60 (FIG. 6) and the via pad 79 is a generally square shaped pad that does not include any cut-outs. A second array 74 is also a 9×3 array and includes alternating the via pads 78 and 79. A third array 76 could be a 9×4 array and includes via pads 80, 81, 82, 83 and 84, as well as other via pads. The via pads preferably are equally spaced at a given pitch. The via pads 80≠84 are variations of the via pad 60 (FIG. 6). Via pad 80 has the upper left portion etched away; via pad 81 has an upper center portion etched away; via pad 82 has the upper right portion etched away; via pad 83 does not have cut-outs along its top and right sides; and via pad 84 does not have cut-outs along its bottom side. It will be understood by those of skill in the art that other variations and combinations of via pad designs may be used. By providing different types of the pads at various locations on the sheet 70, the Pattern Recognition System (PRS) can more readily place and attach different size dice to the sheet 70. In contrast, if all of the pads are the same, the PRS can become confused or it can be more difficult to program the wire bonder to accommodate different sized dice. It should be noted that rectangular pads are preferred over round pads because the PRS system has difficulty locating specific ones of the pads and accurately placing the wire when the pads are round. The sheet 70 also includes marks 85 spaced around its perimeter that may be used as saw singulation guides.

In typical prior art BGAs, it is common for some contact pads on the bottom to not be connected to vias because those contacts are not needed. Thus these are not reusable for other integrated circuits even if they are of comparable size. This universal use aspect can be a significant cost benefit because of the reduced nonrecurring engineering costs and inventory costs. Yet a further benefit is the speed with which a new integrated circuit can be properly packaged. The BGA sheet can be simply wired bonded to the IC and cut to size. Also defects on a BGA sheet of a continuous array would have a reduced impact on the amount of the sheet that is unusable. If any portion of a site has a defect for a site that is dedicated to a single integrated circuit, then that whole site is unusable, regardless of how much of the site is not defective. A BGA sheet of continuous array could use a simple sorting method during inspection at the substrate supplier to identify high and low defect density sheets. Higher defect density sheets would have improved sheet area utilization when assembled with a integrated circuits using smaller package footprints, compared to integrated circuits on large package substrates.

Another issue with traces is that they sometimes crack under temperature stresses. The elimination or reduction in traces in the substrate of the present invention correspondingly eliminates or reduces this problem of traces cracking, thus improving yield. By reducing the quantity of traces and freeing up available routing channel, the remaining traces can be designed at wider widths. Fewer but wider traces reduces the problem of trace cracking, thus improving the package substrate reliability.

The description of the preferred embodiments of the present invention have been presented for purposes of illustration and description, but is not intended to be exhaustive or to limit the invention to the forms disclosed. It will be appreciated by those skilled in the art that changes could be made to the embodiments described above without departing from the broad inventive concept thereof. Thus, aspects of the present invention may be applicable to all wire bonded package types, including but not limited to BGA, QFN, QFP, PLCC, CUEBGA, TBGA, and TSOP. Further, various types of vias may be used. For example, a blind via, filled via, punched via, laser via, etched via, and build-up via as well as others. It is understood, therefore, that this invention is not limited to the particular embodiments disclosed, but covers modifications within the spirit and scope of the present invention as defined by the appended claims. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or an essential feature or element of any or all the claims.

The invention claimed is:

1. A bonding pad electrically coupled to a via that extends from one side of a substrate to an opposing side of a substrate, the bonding pad comprising:
   a photo mask area;
   a clearance area located within the photo mask area;
   a land area, located within the clearance area, for receiving at least one insulated bond wire, and wherein at least one of the photo mask area, the clearance area and the land area has at least one sharp edge that assists a pattern recognition system of a wire bonder in locating the at least one bond wire on the land area, and wherein the photo mask area, the clearance area and the land area surround the via; and a plug located within the via, wherein the at least one insulated bond wire is electrically coupled to the via.

2. The bonding pad of claim 1, wherein the clearance area comprises BT.

3. The bonding pad of claim 1, wherein the land area comprises a conductive metal.

4. The bonding pad of claim 3, wherein the conductive metal comprises at least one of copper, gold, silver and aluminum.

5. The bonding pad of claim 1, wherein the photo mask area and the clearance area are generally rectangular.

6. The bonding pad of claim 5, wherein the land area is generally rectangular.

7. The bonding pad of claim 6, wherein the land area has a plurality of sharp edges that assist the pattern recognition system of the wire bonder in locating the land area and attaching the at least one bond wire thereto.

8. The bonding pad of claim 7, wherein the land area has one or more cut outs on each side that are perpendicular to the side and extend toward the via.

9. The bonding pad of claim 1, further comprising a solder mask area located within the land area and surrounding the via plug.

10. A bonding pad electrically coupled to a via that extends from one side of a substrate to an opposing side of a substrate, the bonding pad comprising:
 a photo mask area surrounding the via;
 a clearance area located within the photo mask area and surrounding the via;
 a land area, located within the clearance area and surrounding the via, for receiving at least one bond wire, wherein at least one of the photo mask area, the clearance area and the land area has at least one sharp edge that assists a pattern recognition system of a wire bonder in locating the at least one bond wire on the land area.

11. The bonding pad of claim 10, wherein the clearance area comprises BT.

12. The bonding pad of claim 10, wherein the land area comprises a conductive metal.

13. The bonding pad of claim 12, wherein the conductive metal comprises at least one of copper, gold, silver and aluminum.

14. The bonding pad of claim 10, wherein the photo mask area and the clearance area are generally rectangular.

15. The bonding pad of claim 14, wherein the land area is generally rectangular.

16. The bonding pad of claim 15, wherein the land area has a plurality of sharp edges.

17. The bonding pad of claim 16, wherein the land area has one or more cut outs on each side thereof that are perpendicular to the side and extend toward the via.

18. The bonding pad of claim 15, further comprising a solder mask area located within the land area and surrounding the via.

* * * * *